United States Patent [19]

Mori

[11] Patent Number: 5,245,384
[45] Date of Patent: Sep. 14, 1993

[54] ILLUMINATING OPTICAL APPARATUS AND EXPOSURE APPARATUS HAVING THE SAME

[75] Inventor: Takashi Mori, Kanagawa, Japan

[73] Assignee: Nikon Corporation, Tokyo, Japan

[21] Appl. No.: 899,546

[22] Filed: Jun. 16, 1992

[30] Foreign Application Priority Data

Jun. 17, 1991 [JP] Japan .................................. 3-170374

[51] Int. Cl.$^5$ .......................... G03B 27/42; F21V 7/04
[52] U.S. Cl. ........................................ 355/67; 355/53; 362/268
[58] Field of Search ........................ 355/53, 46, 67, 71; 362/268

[56] References Cited

U.S. PATENT DOCUMENTS

| | | | |
|---|---|---|---|
| 4,497,015 | 1/1985 | Konno et al. | 362/268 |
| 4,668,077 | 5/1987 | Tanaka | 355/53 X |
| 4,739,373 | 4/1988 | Nishi et al. | 355/53 |
| 4,851,882 | 7/1989 | Takahashi et al. | 355/46 |
| 4,851,978 | 7/1989 | Ichihara | 355/67 X |
| 4,939,630 | 7/1990 | Kikuchi et al. | 362/268 |
| 5,121,160 | 6/1992 | Sano et al. | 355/71 X |
| 5,160,962 | 11/1992 | Miura et al. | 355/53 |

FOREIGN PATENT DOCUMENTS 59-155843 5/1984 Japan .

*Primary Examiner*—Richard A. Wintercorn
*Attorney, Agent, or Firm*—Keck, Mahin & Cate

[57] ABSTRACT

An illuminating optical apparatus adapted to eliminate the occurrence of any exposure light quantity loss and maintain an uniform exposure condition even if the $\sigma$ value of an illuminating system is varied in response to changing of the pattern of a reticle to be exposed and an exposure apparatus having such illuminating optical apparatus. The illuminating optical apparatus includes an elliptical mirror for condensing an illuminating light from a light source, a collimating optical system for collimating the condensed illuminating light, an optical integrator for forming a plurality of secondary light sources from the coliminated illuminating light, and an afocal zoom optical system arranged in an optical path between the collimating optical system and the optical integrator to vary the secondary light sources in size. An image of an opening of the elliptical mirror is formed at an entrance surface of the optical integrator or in the vicinity thereof.

17 Claims, 5 Drawing Sheets

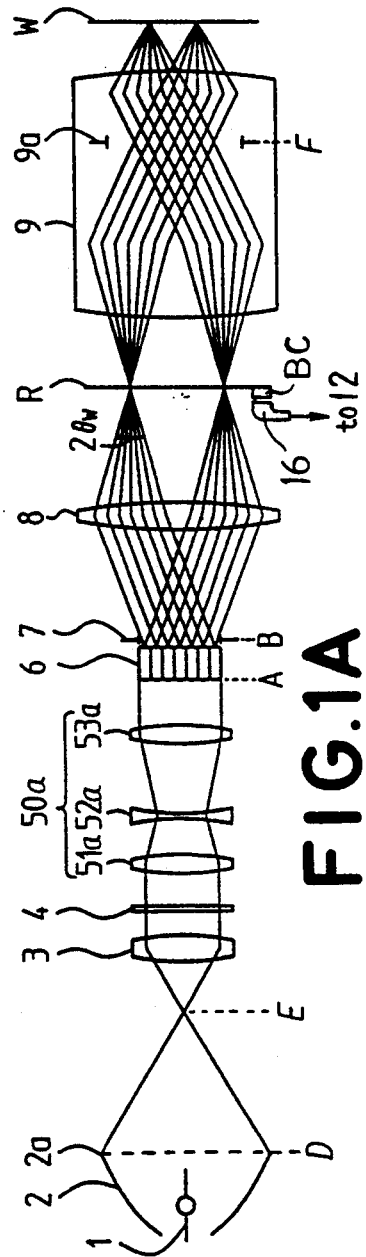
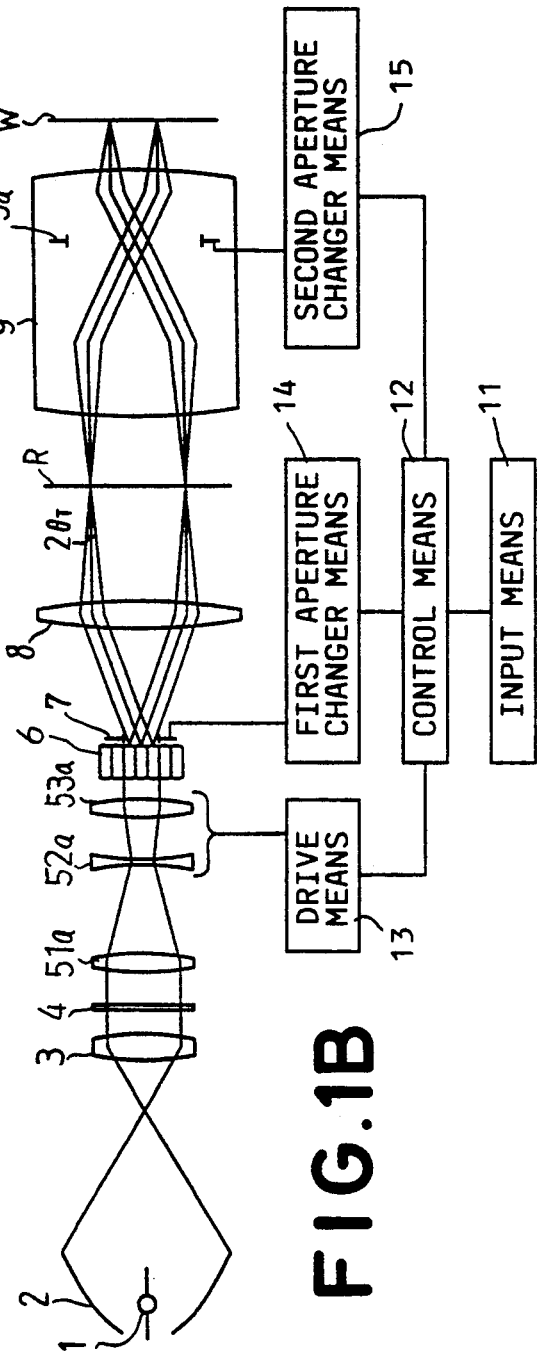

ILLUMINATING OPTICAL APPARATUS AND EXPOSURE APPARATUS HAVING THE SAME

BACKGROUND OF THE INVENTION

1. Field of the Invention

The present invention relates to illuminating optical apparatus and exposure apparatus well suited for the manufacture of semiconductor devices.

2. Description of the Prior Art

Up to date, reduction projection-type exposure apparatus have been used in the manufacture of semiconductor devices which are composed of very fine patterns such as LSIs and VLSIs and much efforts have been made for the transfer of finer patterns. To cope with such trend toward the realization of finer patterns, attempts have been made to increase the numerical aperture (hereinafter referred to as an NA) of a projection optical system along with a reduction in the wavelength of an exposure light and projection optical systems of over NA=0.5 have been realized.

In the actual projection exposure using a projection optical system having such a large NA, depending on the minimum line width, etc., of a pattern to be transferred, it is important to optimize the NA of the projection optical system and the illumination condition. This illumination condition is determined by adjusting a $\sigma$ value (referred to as a so-called coherent factor) which corresponds to the ratio of the NA of the illuminating optical system to the NA of the projection optical system, and to adjust the ratio between the NAs of the two optical systems so as to attain the Proper balance between the resolving power and contrast of a given pattern has been proposed for example in Japanese Laid-Open Patent No. 59-155843, etc.

According to the proposed apparatus, a variable aperture stop having a variable opening is arranged at a position on the exit side of a fly-eye lens where secondary light source images are formed in an illuminating optical system and the size of the opening of the variable aperture stop is varied, thereby controlling the size of the light source images. In other words, since the $\sigma$ value corresponds to the ratio between the sizes of the pupils of the projection optical systems, the degree of light shield for the actually formed light source image is varied so that the size of the light source images is varied and thus the NA of the illuminating optical system is substantially varied. Thus, in accordance with the fineness of a pattern to be projected and exposed, the optimization of the illumination condition or the optimization of the $\sigma$ value is sought so as to attain the optimum condition between the resolving power and contrast of the given pattern.

Generally, with this type of exposure illuminating apparatus, an illumination of a higher illuminance is required on a surface to be irradiated (a mask or a reticle) in order to improve the throughput during the exposure and printing of fine patterns. With the previously mentioned conventional apparatus, however, to ensure that the optimization of the $\sigma$ value or the illumination condition is accomplished to ensure the optimum conditions for the resolving power and contrast of a given pattern in accordance with the fineness of the pattern to be projected and exposed, the size of the opening of the variable stop is adjusted. Therefore, if the opening is decreased, the peripheral portion of secondary light source images is blocked by the variable stop thus causing a loss in the light quantity.

In other words, since all the light beam from the light source is irradiated when the $\sigma$ value is increased to a maximum (when the diameter of the variable aperture stop is made maximum), the maximum illuminance is obtained on the surface to be irradiated (the mask or the reticle). When the $\sigma$ value is made smaller than the maximum value (when the diameter of the variable aperture stop is decreased), however, a part of the light beams from the secondary light source images is blocked by the variable stop and thus the total light quantity of the irradiated light is decreased and the illuminance on the irradiated surface is decreased. As a result, there is the fatal disadvantage that the exposure time required for the proper exposure is increased and consequently the throughput of the exposure operation is inevitably deteriorated.

SUMMARY OF THE INVENTION

It is the primary object of the present invention to provide an illuminating optical apparatus which overcomes the foregoing deficiencies of the conventional apparatus so that even if the $\sigma$ value is varied in accordance with a pattern to be projection exposed, an irradiation light is efficiently directed to a surface to be irradiated and the irradiation light is utilized effectively thereby irradiating the surface uniformly with a higher illuminance but without causing any deterioration of the throughput due to a loss in the light quantity as in the past, and an exposure apparatus having such illuminating optical system.

To accomplish the above object, in accordance with an aspect of the present invention there is thus provided an illuminating optical apparatus including light source means for supplying an illuminating light, an elliptical mirror for condensing the illuminating light from the light source means, a collimating optical system for collimating the illuminating light condensed by the elliptical mirror, an optical integrator for forming a plurality of secondary light sources by means of the collimated light beam from the collimating optical system, a condenser optical system for condensing the light beams from the secondary light sources to irradiate a surface to be irradiated in a superposing manner, and an afocal zoom optical system arranged in the light path between the collimating optical system and the optical integrator to vary the size of the secondary light sources, and it is adapted so that an image of the opening of the elliptical mirror is formed on the light source-side surface of the optical integrator or near thereto through the collimating optical system and the afocal zoom optical system.

In accordance with another aspect of the present invention, there is provided an illuminating optical apparatus including a light source for supplying an illuminating light, an elliptical mirror for condensing the illuminating light from the light source, a collimating optical system for collimating the illuminating light condensed by the elliptical mirror, an optical integrator for forming a plurality of secondary light sources by means of the collimated light beam from the collimating optical system, a condenser optical system for condensing the light beams from the secondary light sources to illuminate a surface to be irradiated in a superposing manner, and an afocal zoom optical system arranged in the optical path between the collimating optical system and the afocal zoom optical system to vary the size of the secondary light sources, and it is adapted so that the opening of the elliptical mirror is substantially conjugate to the light source-side surface of the optical integrator with respect to the collimating optical system and the afocal zoom optical system.

In accordance with still another aspect of the present invention, there is provided an exposure apparatus for transferring the circuit pattern on a reticle onto a wafer through a projection optical system, and the exposure apparatus includes light source means for supplying an illuminating light, an elliptical mirror for condensing the illuminating light from the light source means, a collimating optical system for collimating the illuminating light condensed by the elliptical mirror, an optical integrator for forming a plurality of secondary light sources from the collimated light beam from the collimating optical system, a condenser optical system for condensing the light beams from the secondary light sources to uniformly illuminate the reticle, and an afocal zoom optical system arranged in the optical path between the collimating optical system and the optical integrator to vary the size of the secondary light sources, and it is adapted so that the opening of the elliptical mirror is substantially conjugate to the light source-side surface of the optical integrator with respect to the collimating optical system and the afocal zoom optical system.

The above and other objects, features and advantages of the present invention will become fully apparent from the following description of its embodiments intended for no limitation taken in conjunction with the accompanying drawings.

BRIEF DESCRIPTION OF THE DRAWINGS

FIG. 1A is an optical path diagram schematically showing, in a maximum magnification condition, the construction of an exposure apparatus having an illuminating optical system according to an embodiment of the present invention;

FIG. 1B is an optical path diagram schematically showing the exposure apparatus of FIG. 1A in a minimum magnification condition.

DESCRIPTION OF THE PREFERRED EMBODIMENTS

In order to clarify the features of the illuminating optical apparatus according to the aspects of the present invention and the exposure apparatus having the same, a conventional apparatus will be first described briefly hereunder.

Figure 5:
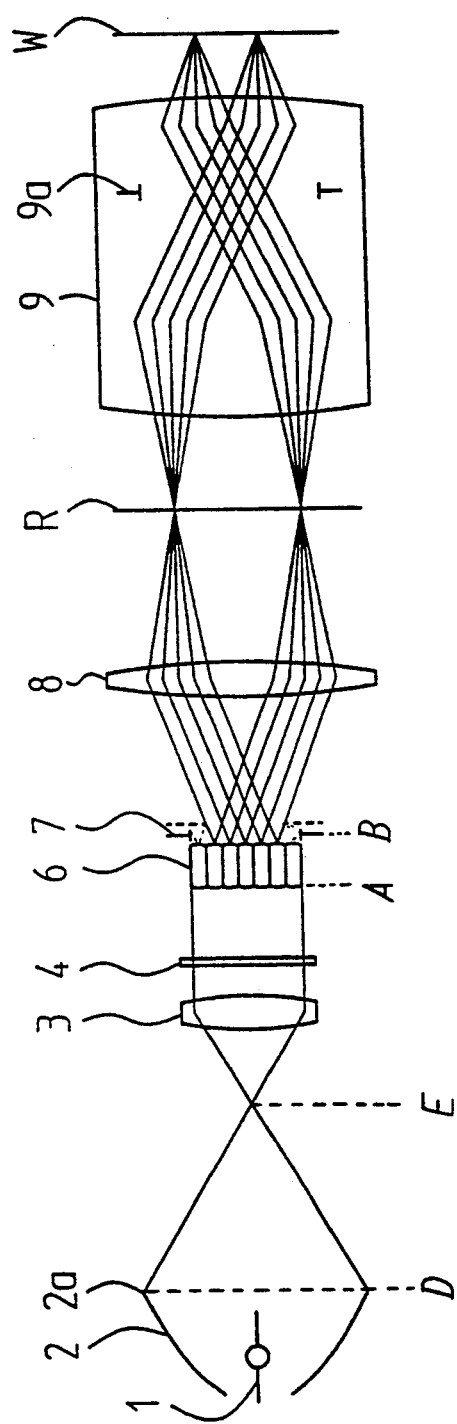
FIG. 5 is an optical path diagram showing the lens construction of a conventional exposure apparatus.

FIG. 5 schematically shows the lens construction in the conventional exposure apparatus illuminating optical system on which the present invention is based and its optical path diagram. In the Figure, the light from a light source 1 is reflected and condensed by an elliptical mirror 2 and it is then converted to a collimated light beam by a collimator lens 3. The construction of this light source system for supplying the collimated light beam is not especially limited to the one shown in FIG. 5 and it may be of the type using a laser light source or the like.

An exposure light wavelength is selected by a filter 4 disposed on the optical path from the collimated light beam converted by the collimator lens 3. Then, the collimated light beam of the exposure wavelength is introduced into an optical integrator 6 so that a large number of secondary light sources are formed at a position B on the exit side of the optical integrator 6 and a fixed aperture stop 7 is arranged at the position B.

Then, the large number of light beams from the secondary light sources are condensed in a superposed manner on a surface (a reticle) R to be irradiated through a condenser lens 8, thereby illuminating the reticle R with a uniform illuminance. As a result of this illumination, the given pattern formed on the reticle R is projected onto a wafer W by a projection objective lens 9. According to this illuminating apparatus, a plurality of secondary light source images are formed on a pupil 9a of the projection objective lens 9, thereby accomplishing the so-called Köhler's illumination.

Then, in the conventional apparatus, the previously mentioned $\sigma$ value is modified by the aperture stop arranged at the position B. In other words, in the illuminating apparatus of FIG. 4 the diameter of the aperture stop 7 arranged at the position B where the secondary light sources are formed has a reduced value as shown in the Figure and a part of the outer periphery of the illuminating light beams is blocked thereby making it possible to vary the $\sigma$ value as mentioned previously. However, since a loss in the irradiation light quantity occurs due to the partial blocking by the aperture stop 7, even under the condition of the optimum $\sigma$ value, the total irradiation light quantity is decreased and thus it is impossible to effect an efficient illumination.

The present invention notes the fact that a change in the $\sigma$ value changes the size of the light source images of the illuminating optical system and in this case there is caused no light quantity loss corresponding to the ratio between the size of the light source images of the illuminating optical system formed on the pupil of the projection objective lens and the size of the pupil of the projection objective lens.

Figure 3:
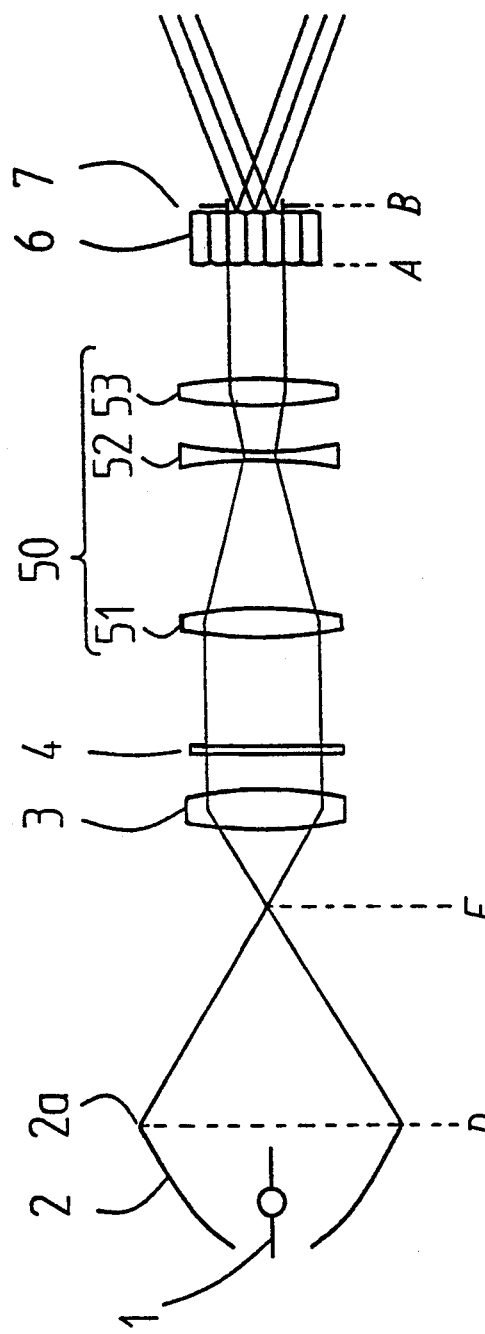
FIG. 3 is a partial optical path diagram useful for explaining the actions in the illuminating system of the exposure apparatus according to the present invention.

The features of the present invention will now be described in detail with reference to FIG. 3 showing the construction of principal parts of the present invention.

In the case of the illuminating optical apparatus shown in FIG. 3, the apparatus has a basic construction composed of a light source system including an elliptical mirror 2, a light source 1 positioned in the vicinity of the first focal point of the elliptical mirror and a collimating optical system 3 for converting the light beam reflected from the elliptical mirror to a collimated light beam, an afocal variable magnification or zoom optical system 50 for converting the collimated light beam to a desired light beam diameter, an optical integrator 6 for forming a plurality of secondary light sources B from the collimated light beam, and a condenser lens for condensing the light beams from the plurality of secondary light sources formed by the optical integrator 6 so as to illuminate in a superposing manner a surface to be irradiated.

In accordance with the present invention, in the illuminating optical apparatus the focal distance of the afocal zoom optical system 50 is made variable so that the size of the plurality of secondary light sources B can be varied while maintaining constant the area of the surface R to be irradiated and the illuminance on the surface R. In other words, as shown in FIG. 3, the afocal zoom optical system 50 includes a zoom lens system (51, 52, 53) and it is arranged in the optical path of the collimated light beam emitted from the light source system to vary the diameter of the light beam.

In this case, since the collimated light beam adjusted in beam diameter is introduced into the optical integrator 6, the size of the secondary light sources can be varied while completely eliminating the danger of causing a light quantity loss of the illuminating light due to varying the diameter of the light beam incident to the optical integrator 6 in accordance with the diameter of the aperture stop as in the case of the conventional apparatus.

In accordance with the present invention, a laser light source may be used as the light source system for supplying the collimated light beam. In this case, the diameter of the collimated light beam from the laser light source is varied by the afocal zoom optical system 50. As a result, the size of the plurality of secondary light sources formed by the optical integrator 6 can be made variable.

Then, with the construction as shown in FIG. 3, where the entrance surface of the optical integrator 6 (the front focal plane of the optical integrator 6) is arranged at a position A apart from the position B where an image of the opening 2a of the elliptical mirror 2 is formed, if the light source 1 (e.g., a mercury vapor lamp) generates light having a divergent spread, a light quantity loss due to the spread (the areas indicated by the hatched portions C in FIG. 4) is caused. It is to be noted that where the light source system for supplying the collimated light beam is composed of a laser light source, there is caused no spread as the areas indicated by the hatched portions C of FIG. 4 and therefore there is caused no problem of light quantity loss.

Thus, in order to avoid such loss, in accordance with the present invention the afocal zoom optical system 50 is constructed in such a manner that an image of the opening 2a of the elliptical mirror 2 is focused near to the light source side of the optical integrator 6 (near to the front focal point of the optical integrator 6). As will also be seen from FIG. 4, the reason for this is that if the image of the opening 2a of the elliptical mirror 2 is formed in the vicinity of the entrance surface A of the optical integrator 6, the previously mentioned spread of the light beam (the hatched portions C due to it) is not caused when the light beam is introduced into the optical integrator 6, thereby avoiding the previously mentioned light quantity loss.

This can be accomplished by reducing the shift of the imaging surface as far as possible during the zooming (changing the focal distance) of the afocal zoom optical system 50, and it is only necessary that the previously mentioned imaging condition is maintained at least in the exposing operating condition before and after the performance of the zooming operation.

In this way, in accordance with the present invention, while maintaining constant the size of an area to be irradiated, the $\sigma$ value can be varied without causing any light quantity loss of the illuminating light. It is to be noted that a variable aperture stop 7 should preferably be arranged on the exit side of the optical integrator 6 as shown in FIG. 3 in consideration of an error in the size of the secondary light sources (resulting in an error in the $\sigma$ value) due to the afocal zoom optical system 5, the speed of the light beam, etc.

In this case, when varying the $\sigma$ value, the size of the opening of the variable aperture stop 7 should preferably be varied in response to a variation in the focal distance of the afocal zoom optical system (a variation in the beam diameter of the collimated light beam).

Also, where a white light source (mercury arc lump or the like) is used as the light source instead of the monochromatic light source, it is desirable to arrange wavelength extracting means which selects light of the exposure wavelength and this wavelength extracting means should preferably be arranged in the parallel optical path in the illuminating optical system. In this case, the parallel optical path in the illuminating optical system is formed between the collimating optical system 3 and the optical integrator 6.

Figure 4:
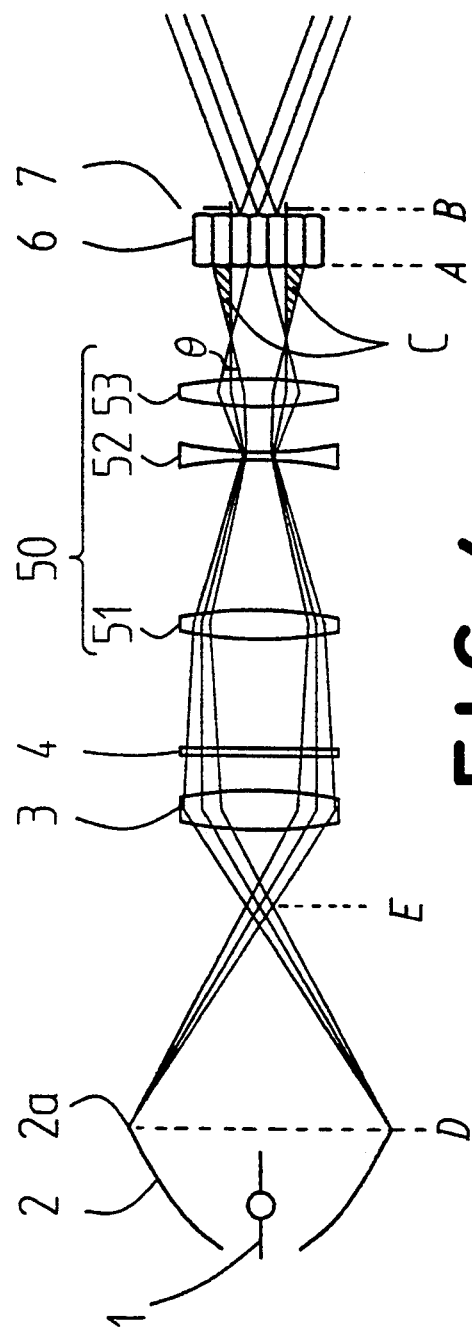
FIG. 4 is a partial optical path diagram similar to FIG. 3, which is useful for explaining the actions in the illuminating system of the exposure apparatus according to the present invention.

However, if the wavelength extracting means is arranged in the parallel optical path to the afocal zoom optical system 50 and the optical integrator 6, as shown in FIG. 4, there is caused a problem that due to the zooming of the afocal zoom optical system 50, the numerical aperture NA of the light beam forming the image of the opening 2a of the elliptical mirror or the angle $\theta$ is varied and therefore the wavelength selection characteristic of the wavelength extracting means itself is varied.

As a result, it is advantageous to arrange the wavelength extracting means in the parallel optical path to the collimating optical system 3 and the afocal zoom optical system 50. When this occurs, during the zooming by the afocal zoom optical system 50, there is no danger of any variation in the wavelength selection characteristic of the wavelength extracting means itself but it is always stabilized and also the proper exposure can be attained with the desired $\sigma$ value.

As described hereinabove, in accordance with the present invention the exposure operation can always be performed with a uniform light quantity under the optimum $\sigma$ value condition which is dependent on the type of a reticle to be exposed (or the minimum line width of the corresponding pattern). Namely, in accordance with the present invention, even if the $\sigma$ value is varied in accordance with the reticle used, the surface to be irradiated can be irradiated uniformly with high illuminance and without causing any loss in the light quantity.

Therefore, when the exposure operation is effected in accordance with the present invention, in accordance with the minimum line width of a pattern to be exposed and printed or the depth of focus of the projection optical system, the transfer can always be effected with the same exposure light quantity under the optimum $\sigma$ value condition thereby providing the illuminating optical apparatus and the exposure apparatus which are high in efficiency and having practically no danger of deteriorating the throughput.

A typical embodiment of the present invention will now be described with reference to the drawings. FIG. 1A is an optical path diagram showing from the principle point of view the optical construction of an exposure apparatus according to a first embodiment of the present invention, and in this case an afocal zoom optical system 50a having a zooming function is in the maximum magnification condition. Also, FIG. 1b shows a case in which the afocal zoom optical system 50a is in the minimum magnification condition.

In this embodiment, a light source 1 is arranged at a first focal position of an elliptical mirror 2 and a mercury vapor lamp, for example, is used as the light source 1. The illuminating light emitted from the light source 1 is reflected and condensed by the elliptical mirror 2 and a light source image is formed at a second focal position E of the elliptical mirror 2. The light from the light source image is condensed and converted to a collimated light beam by a collimator lens 3 (collimating optical system). Then, a wavelength selection filter 4 (wavelength extracting means) is arranged in the optical path of the collimated light beam so that the light beam passed through the filter 4 is composed of a monochromatic light having only an exposure wavelength.

After passing through the filter 4, the collimated light beam of the exposure wavelength alone is introduced through the afocal zoom optical system 50a into an optical integrator 6 (fly-eye lens) composed of a plurality of bar lens arranged in juxtaposition thereby forming a plurality of secondary light sources at its exit surface position B (the rear focal position of the optical integrator 6). Then, the resulting plurality of emerging light beams irradiate in a superposing manner a reticle R through a condenser lens (condenser optical system) 8. Then, the transmitted light through it projects a given pattern on the reticle R onto a wafer W through a projection objective lens (projection optical system) 9. It is to be noted that a variable aperture stop 7 is arranged at the position B where the secondary light sources are formed and a variable aperture stop 9a is arranged at the pupil (entrance pupil) position F of the projection objective lens 9.

The afocal zoom optical system 50a includes a first lens group 51a having a positive refractive power, a second lens group 52a having a negative refractive power and a third lens group 53a having a positive refractive power whereby during the zooming operation of the afocal zoom optical system 50a, as shown in Figs. 1A and 1B, the second lens group 52a is moved toward the surface to be irradiated and the third lens group 53a is moved toward the surface to be irradiated by a different amount of movement. These lens groups are moved by drive means 13 and their amounts of movement are controlled by control means 12.

In this case, when the magnification of the afocal zoom optical system 50a is determined (at the stage that the previously mentioned $\sigma$ value is determined in accordance with the line width of the reticle to be exposed or the like), the positions of arrangement of the respective lens groups of the afocal zoom optical system 50a are correspondingly determined. For this purpose, the arranging positions of the lens groups corresponding to various magnifications (reticles) to be used may for example be stored preliminarily so that by simply selecting and inputting a reticle to be used to input means 11, the movement of the lens groups of the afocal zoom optical system 50a is completed rapidly.

The control means 12 stores the optimum $\sigma$ value for each of various reticles R to be used (or the minimum line width of the corresponding pattern). As a result, the control means 12 moves through the drive means 13 the lens groups (52a, 53a) of the afocal zoom optical system 50a in accordance with each of the various reticles R. At the same time, the control means 12 sends control signals to first and second aperture changer means 14 and 15 to respectively set the proper sizes for the apertures of the variable aperture stops 7 and 9a. Each of these cooperative mechanisms can be realized by either one of electrical and mechanical cooperative mechanisms.

Then, while the magnification of the afocal zoom optical system 50a is changed in response to the movement of the lens groups (52a, 53a) by the drive means 13, an image of the opening 2a of the elliptical mirror 2 is formed in the vicinity of the entrance side front position A of the optical integrator 6 (or in the vicinity of the front focal point of the optical integrator 6) so that in the conditions before and after the movement, the collimated light beams of different beam diameters are directed without beam spread to the optical integrator 6. Thus, it will be seen that this illuminating optical system is constructed such that the position of the substantial light source plane (the position B of the secondary light sources) is constant and only the size of the light sources is variable and that the total light quantity is not changed.

It is to be noted that the construction shown in FIG. 1 is such that the position E of the light source image formed at the second focal position by the elliptical mirror 2, the position B of the exit-side surface of the optical integrator 6 where the substantial secondary light sources are formed (i.e., the rear focal position of the optical integrator 6) and the pupil (entrance pupil) position F of the projection objective lens 9 are conjugate to each other.

This will be described in greater detail. The light source image position E of the elliptical mirror is conjugate to the position B of the exit-side surface of the optical integrator 6 (the rear focal position of the optical integrator 6) with respect to the collimator lens 3, the afocal zoom optical system 50a and the lenses on the entrance side of the optical integrator 6. Then, the position B of the exit-side surface of the optical integrator 6 is conjugate to the pupil position F of the projection objective lens with respect to the condenser lens 8 and the lens system extending from the entrance surface to the pupil plane within the projection objective lens 9.

With the construction described above, even during the zooming operation by the afocal zoom optical system, the Köhler's illumination is maintained and the object surfaces (the reticle R and the wafer W) can be illuminated uniformly.

Also, the position D of the opening 2a of the elliptical mirror 2 is substantially conjugate to the position A at the entrance-side surface of the optical integrator 6 which is arranged near to the position where the image of the opening 2a of the elliptical mirror 2 is formed (the front focal position of the optical integrator 6), and also the position A of the entrance-side surface of the optical integrator 6 is conjugate to the reticle R and the wafer W, respectively.

This will be explained in greater detail. The position D of the opening 2a of the elliptical mirror is conjugate to the reticle R (the surface to be irradiated) with respect to the collimator lens 3 and the afocal zoom optical system 50a, and the entrance-side surface A of the optical integrator 6 (the front focal position of the optical integrator 6) is conjugate to the reticle R with respect to the exit-side lenses of the optical integrator 6 and the condenser lens 8. Then, the reticle R is conjugate to the wafer W with respect to the projection objective lens 9.

By virtue of this construction, even during the zooming operation by the afocal zoom optical system, there is no danger of any light quantity loss due to the light supplied from the light source 1 and having a spread and an efficient illumination is attained.

Thus, since the dual conjugate relations or the conjugate relations on the illuminating optical system side with respect to the object surface (the reticle R and the wafer W) of the projection objective lens 9 and the conjugate relation on the illuminating optical system side with respect to the pupil plane of the projection objective lens 9 are maintained simultaneously, the illumination can be accomplished with a high illumination efficiency and uniform illuminance while controlling the size of the secondary light sources without blocking the illuminating light.

Figure 2A:
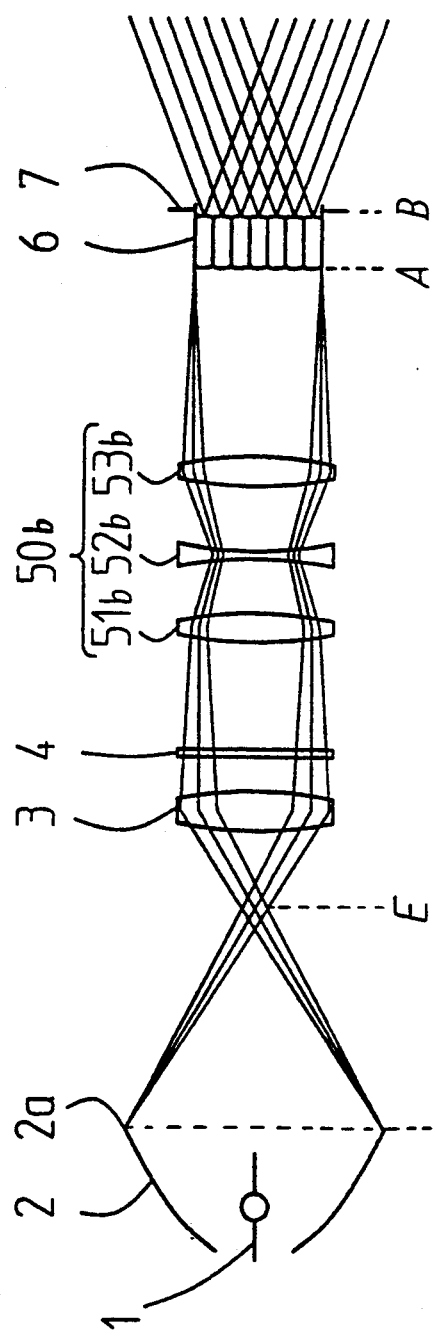
FIG. 2A is an optical path diagram schematically showing, in a maximum magnification condition, the construction of the illuminating system portion of an exposure apparatus according to another embodiment of the present invention.
Figure 2B:
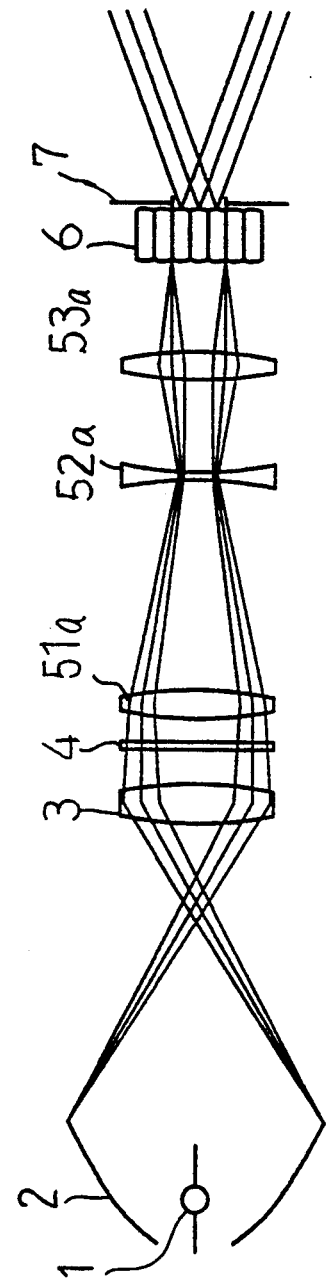
FIG. 2B is an optical path diagram schematically showing the illuminating system portion of FIG. 2A in a minimum magnification condition.

Next, a second embodiment of the present invention having a greater range of magnification variations will be described with reference to FIGS. 2a and 2b. Also, in the second embodiment, its optical system is constructed to maintain the same dual conjugate relations as in the first embodiment. As shown in FIGS. 2a and 2b, the second embodiment is so constructed that a first lens group 51b of an afocal zoom optical system 50b is moved toward the light source side contrary to second and third lens groups 52b and 53b and their amounts of movement are different from one another.

Here, it is needless to say that the positional relations are maintained such that even during the zooming operation of the afocal zoom optical system 50b, an image of the opening 2a of an elliptical mirror 2 is focused in the vicinity of the entrance-side surface A of an optical integrator 6 (the front focal position of the optical integrator 6) as in the case of the first embodiment. Further, in the second embodiment the amounts of movement of the respective lens groups of the afocal zoom optical system 50b are controlled in such a manner that even during the movement of these lens groups, the image of the opening 2a is not moved in the vicinity of the entrance side A of the optical integrator 6.

Thus, even if the range of magnification variations is great and also the magnification is determined arbitrarily, it is possible to completely avoid any light quantity loss due to the previously mentioned spreading of the light source and also it is possible to vary only the size of the light soruces without substantially changing the position of the light sources (the secondary light sources), thereby always effecting the exposure with the same light quantity.

As described hereinabove, in accordance with the above-mentioned embodiments of the present invention only the size of the substantial light sources B (the secondary light sources) formed by the optical integrator 6 can be controlled without changing the position of these light sources and the total light quantity. As a result, as shown in Figs. 1a and 1b and FIGS. 2a and 2b, even if the size of the secondary light source images is reduced due to the zooming of the afocal zoom optical system 50a from the maximum magnification condition to the minimum magnification condition, the desired $\sigma$ value can be maintained in response to a decreasing change in the numerical aperture NA of the illuminating optical system from sin $\theta_W$ to sin $\theta_T$.

It is needless to say that even if the numerical aperture NA of the illuminating system is decreased, there is caused no loss in the total light quantity during the exposure operation. The lens groups forming the afocal zoom optical system 50 having a zooming function may be comprised of more than three groups, and also lens groups respectively having positive and negative refractive powers may be suitably combined.

Thus, in accordance with the embodiments of the present invention the $\sigma$ value can be changed suitably with high illumination efficiency so that the illumination can be effected under the optimum illumination condition corresponding to the minimum line width of a pattern to be printed and the focus depth of the projection optical system without any deterioration in the throughput of the exposure operation.

It is to be noted that where the input means 11 shown in FIG. 1a has a computing function for calculating the proper NA of the projection lens 9 and the proper $\sigma$ value from only the inputted minimum line width information, it is possible to construct so that in accordance with the calculation result of the $\sigma$ value the control means 12 calculates the amounts of reduction of the variable aperture stop 9a of the projection lens 9 and the variable aperture stop 7 of the illuminating optical system as well as the amounts of movement of the lens groups for the zooming of the afocal zoom optical system 50 to control the amounts of movement of the afocal zoom optical system 50 through the drive means 13 and it also controls the diameter of the variable aperture stop 9a of the projection lens 9 and the diameter of the variable aperture stop 7 of the illuminating optical system.

Also, if, for example, a reticle R is used in which a mark BC, e.g., a bar code incorporating information of the minimum line width on a wafer, etc., is marked on the outer side of the irradiation area of the reticle R as shown in FIG. 1a, mark detecting means 16 such as a bar code reader for detecting the mark BC may be mounted at a suitable location so that in accordance with the information detected by the mark detecting means 16, the control means 12 controls the diameter of the variable aperture stop 9a of the projection lens 9, the diameter of the variable aperture stop 7 of the illuminating optical system and the amounts of movement of the afocal zoom optical system 50a.

Still further, instead of the variable aperture stop 7 of the illuminating optical system whose size of the diameter of the aperture is variable, a turret-type (revolver-type) variable aperture may be used in which a plurality of apertures of different diameters are formed circumferentially in a base plate of a circular shape and the $\sigma$ value is changed by rotating the base plate.

What is claimed is:

1. An illuminating optical apparatus comprising:
light source means for supplying an illuminating light;
an elliptical mirror for condensing the illuminating light from said light source means;
a collimating optical system for collimating the illuminating light condensed by said elliptical mirror;
an optical integrator for forming a plurality of secondary light sources from the collimated light from said collimating optical system;
a condenser optical system for condensing a plurality of light beams from said secondary light sources to illuminate in a superposing manner a surface to be irradiated; and
an afocal zoom optical system arranged in an optical path between said collimating optical system and said optical integrator to vary said secondary light sources in size, said collimating optical system and said afocal zoom optical system being adapted so that an image of an opening of said elliptical mirror is formed at an entrance surface of said optical integrator or at a position near thereto.

2. An illuminating optical apparatus according to claim 1, wherein said afocal zoom optical system includes a plurality of lens group, and wherein at least one of said plurality of lens groups is moved in the direction of an optical axis thereof to vary the size of said secondary light sources.

3. An illuminating optical apparatus according to claim 1, further comprising stop means arranged at an exit-side focal position of said optical integrator or in the vicinity thereof to regulate the size of said secondary light sources varying in response to a zooming operation of said afocal zoom optical system.

4. An illuminating optical apparatus according to claim 1, further comprising wavelength extracting means arranged between said collimating optical system and said afocal zoom optical system for extracting light of a predetermined wavelength from said illuminating light.

5. An illuminating optical apparatus according to claim 2, wherein the entrance surface of said optical integrator and said surface to be irradiated are adapted to be substantially conjugate to each other.

6. An illuminating optical apparatus comprising:
a light source for supplying an illuminating light;
an elliptical mirror for condensing the illuminating light from said light source;
a collimating optical system for collimating the illuminating light condensed by said elliptical mirror;
an optical integrator for forming a plurality of secondary light sources from the collimated light beam from said collimating optical system;
a condenser optical system for condensing a plurality of light beams from said secondary light sources to illuminate in a superposing manner a surface to be irradiated; and
an afocal zoom optical system arranged in an optical path between said collimating optical system and said optical integrator to vary said secondary light sources in size;
an opening of said elliptical mirror being arranged to be substantially conjugate to an entrance surface of said optical integrator with respect to said collimating optical system and said afocal zoom optical system.

7. An illuminating optical apparatus according to claim 6, wherein said afocal zoom optical system includes at least one movable lens group adapted for movement along an optical axis direction thereof whereby said at least one movable lens group is moved in said optical axis direction to vary the size of said secondary light sources.

8. An illuminating optical apparatus according to claim 7, wherein a condensing position of said illuminating light by said elliptical mirror and a position of an exit surface of said optical integrator are adapted to be substantially conjugate to each other.

9. An illuminating optical apparatus according to claim 8, wherein the entrance surface of said optical integrator and said surface to be irradiated are adapted to be substantially conjugate to each other.

10. An illuminating optical apparatus according to claim 9, further comprising wavelength extracting means arranged between said collimating optical system and said afocal zoom optical system to extract light having a predetermined wavelength from said illuminating light.

11. An exposure apparatus for transferring a circuit pattern on a reticle onto a wafer through a projection optical system, said apparatus comprising:
light source means for supplying an illuminating light;
an elliptical mirror for condensing the illuminating light from said light source means;
a collimating optical system for collimating the illuminating light condensed by said elliptical mirror;
an optical integrator for forming a plurality of secondary light sources from the collimated light beam from said collimating optical system;
a condenser optical system for condensing a plurality of light beams from said secondary light sources to uniformly illuminate said reticle; and
an afocal zoom optical system arranged in an optical path between said collimating optical system and said optical integrator to vary said secondary light sources in size;
an opening of said elliptical mirror being adapted to be substantially conjugate to an entrance surface of said optical integrator with respect to said collimating optical system and said afocal zoom optical system.

12. An exposure apparatus according to claim 11, wherein said afocal zoom optical system includes a plurality of lens groups, and wherein at least one of said plurality of lens groups is moved in the direction of an optical axis of said afocal zoom optical system to vary said secondary light sources in size.

13. An exposure apparatus according to claim 12, wherein the entrance surface of said optical integrator and said reticle are arranged to be substantially conjugate to each other.

14. An exposure apparatus according to claim 12, further comprising:
a first variable aperture stop arranged on an exit side of said optical integrator;
a second variable aperture stop arranged at a pupil position of said projection optical system;
input means for inputting information necessary for obtaining a predetermined optimum illumination condition;
drive means for moving at least one of the lens groups within said afocal zoom optical system in the optical axis direction thereof; and
control means responsive to the input information from said input means to control said first variable aperture stop, said second variable aperture stop and said drive means.

15. An exposure apparatus according to claim 14, wherein a condensing position of said illuminating light by said elliptical mirror and a position of the exit surface of said optical integrator are adapted to be substantially conjugate to each other, and wherein the exit surface of said optical integrator and said second variable aperture stop are adapted to be substantially conjugate to each other.

16. An exposure apparatus according to claim 12, further comprising:
a first variable aperture stop arranged on an exit side of said optical integrator;
a second variable aperture stop arranged at a pupil position of said projection optical system;

mark detecting means for detecting a mark formed on said reticle, said mark including information necessary for obtaining predetermined optimum illumination conditions;

drive means whereby at least one of the lens groups within said afocal zoom optical system is moved in the optical axis direction thereof; and control means responsive to the detected information from said mark detecting means to control said first variable aperture stop, said second variable aperture stop and said drive means.

17. An exposure apparatus according to claim 16, wherein a condensing position of the illuminating light by said elliptical mirror and a position of an exit surface of said optical integrator are adapted to be substantially conjugate to each other, and wherein the exit surface of said optical integrator and said second variable aperture stop are adapted to be substantially conjugate to each other.

* * * * *